(12) United States Patent
Cho (10) Patent No.: US 8,063,435 B2
(45) Date of Patent: Nov. 22, 2011

(54) SEMICONDUCTOR MEMORY AND METHOD FOR MANUFACTURING THE SAME

(75) Inventor: Shien Cho, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 173 days.

(21) Appl. No.: 12/417,186

(22) Filed: Apr. 2, 2009

(65) Prior Publication Data

US 2009/0194809 A1 Aug. 6, 2009

(30) Foreign Application Priority Data

Apr. 2, 2008 (JP) ................... 2008-096373
Feb. 12, 2009 (JP) ................... 2009-030450

(51) Int. Cl.
*H01L 29/792* (2006.01)
(52) U.S. Cl. ........ 257/324; 257/295; 257/315; 257/317; 257/325
(58) Field of Classification Search .................. None
See application file for complete search history.

(56) References Cited

U.S. PATENT DOCUMENTS

| 7,183,166 B2 | 2/2007 | Wang et al. | |
| 2003/0017670 A1* | 1/2003 | Luoh et al. | 438/257 |
| 2005/0202686 A1* | 9/2005 | Saki et al. | 438/783 |

FOREIGN PATENT DOCUMENTS

| JP | 9-115904 | 5/1997 |
| JP | 2005-159266 | 6/2005 |

OTHER PUBLICATIONS

S. Wang et al., "Effect of fabrication process on the charge trapping behavior of SiON thin films", Solid-State Electronics 50 (2006) 1171-1174.
I Levin et al., "Structure, Chemistry, and Electrical Performance of DSilicon Oxide-Nitride Stachs on Silicon", Journal of The Electrochemical Society, 151 (12) G833-G838 (2004).
K. Nomoto et al., "Data Retention Improvement of Metal-Oxide-Nitride-Oxide-Semiconductor Memories Using Silicon-Tetrachloride-Based Silicon Nitride with Ultralow Si—H Bond Density", Japanese Journal of Applied Physics, vol. 43, No. 4B, 2004, pp. 2211-2216.
Yen-Hao Shih et al., Highly Reliable 2-bit/cell Nitride Tapping Flash Memory Using a Novel Array-Nitride-Sealing (ANS) ONO Process.

(Continued)

*Primary Examiner* — N Drew Richards
*Assistant Examiner* — Kyoung Lee
(74) *Attorney, Agent, or Firm* — Young & Thompson (57) ABSTRACT

A semiconductor memory in which a gate insulating film (tunnel insulating film) in a memory cell provides higher operational reliability. The semiconductor memory includes an insulating film 3 between a silicon substrate 1 and a gate electrode 4. The insulating film 3 is composed of a silicon oxide film 3f, a silicon nitride film 3d and a silicon oxide film 3b, stacked in this order between the silicon substrate and the gate electrode from the side of the silicon substrate 1. There are provided hydrogen occluding films 3a, 3c and 3e on an interface between the silicon oxide film 3f and the silicon nitride film 3d, on an interface between the silicon nitride film 3d and the silicon oxide film 3b and on an interface between the silicon oxide film 3b and the gate electrode 4 (FIGS. 1A and 1B).

18 Claims, 6 Drawing Sheets

(EXEMPLARY EMBODIMENT 1)

OTHER PUBLICATIONS

G. Rosenman et al., "Deep traps in oxide-nitride-oxide stacks fabricated from hydrogen and deuterium containing precursors", Journal of Applied Physics 99, 023702 (2006).

Y. Yatsuda et al., "Effects of Hight Temperature Hydrogen Annealing on n-Channel Si-Gate NMOS Devices", 11$^{th}$ Conf. (1979 Int.) Solid State Devices, Tokyo, 1979 Japanese Journal of Applied Physics, vol. 19 (1980) Suppl. 19-1, pp. 219-224.

Z. Liu et al., "A hydrogen storage layer on the surface of silicon nitride films", Applied Physics Letters 92. 192115 (2008).

Z. Liu et al., "Hydrogen Distribution in Oxide-Nitride Stacks and Correlation With Data Retention of Monos Memories".

* cited by examiner

FIG. 1A (EXEMPLARY EMBODIMENT 1)

FIG. 1B (EXEMPLARY EMBODIMENT 1)

FIG. 2A  (EXEMPLARY EMBODIMENT 2)

FIG. 2B  (EXEMPLARY EMBODIMENT 2)

FIG. 3 (EXEMPLARY EMBODIMENT 2)

FIG. 4A (EXEMPLARY EMBODIMENT 2)

FIG. 4B (EXEMPLARY EMBODIMENT 2)

FIG. 4C (EXEMPLARY EMBODIMENT 2)

FIG. 4D (EXEMPLARY EMBODIMENT 2)

FIG. 5A (EXEMPLARY EMBODIMENT 2)

FIG. 5B (EXEMPLARY EMBODIMENT 2)

FIG. 5C (EXEMPLARY EMBODIMENT 2)

FIG. 6A

(EXEMPLARY EMBODIMENT 2)

FIG. 6B

(EXEMPLARY EMBODIMENT 2)

FIG. 6C

(EXEMPLARY EMBODIMENT 2)

FIG. 6D (EXEMPLARY EMBODIMENT 2)

FIG. 6E (EXEMPLARY EMBODIMENT 2)

SEMICONDUCTOR MEMORY AND METHOD FOR MANUFACTURING THE SAME

TECHNICAL FIELD

Reference to Related Application

This application is based upon and claims the benefit of the priorities of Japanese patent applications No. 2008-096373 filed on Apr. 2, 2008 and No. 2009-030450 filed on Feb. 12, 2009, the disclosures of which are incorporated herein in its entirety by reference thereto.

This invention relates to a semiconductor memory having non-volatile memory cells, and a method for manufacturing same. More particularly, it relates to a semiconductor memory having, in its memory cell, a gate insulating film (tunnel insulating film) composed of an ONO stack, and to a method for manufacturing the same.

In a non-volatile memory cell, an ONO stack (a silicon oxide film/a silicon nitride film/a silicon oxide film), capable of trapping electrical charges, are extensively used as a gate insulating film (tunnel insulating film) interposed between a silicon substrate and a gate electrode. The following techniques have so far been disclosed in connection with the ONO stack.

Patent Document 1, for example, discloses a technique of forming a bottom oxide film and a nitride film on a substrate, patterning the so formed films, and rapidly thermally oxidizing the resulting product in an atmosphere containing a radical oxidant to form an oxide film on a patterned surface and on sidewall sections. It is recited that doing so enables a highly reliable ONO structure to be manufactured with a shorter working time with a reduced thermal load.

Patent Document 2 discloses a method for manufacturing an oxide film including an oxidizing step of oxidizing a silicon film, a depressurizing step of depressurizing a chamber after the oxidizing step, and a nitriding step of nitriding the oxidized silicon film as a nitriding gas is supplied into the chamber. The water concentration during the nitriding step is set to not less than 1 ppm and not higher than 10 ppm, and nitride monoxy-nitrogen or monoxydinitrogen is used as the nitriding gas. It is recited that, by heating the silicon oxide film, obtained by the oxidizing step, in an atmosphere of monoxy-nitrogen or monoxy-dinitrogen at a temperature of 900° C. or higher, unpaired bonds may be linked to nitrogen, and/or a Si—H bond or an Si—OH bond in the silicon nitride film is nitrided or oxidized, thereby turning to a Si≡N bond or a $Si_2$=N—O bond to decrease the amount of hydrogen contained in the silicon nitride film.

Non-Patent Document 1 discloses an ONO stack in which a thin SiON film is interposed between a top oxide film and a nitride film, that is, a structure of $SiO_2$/SiON/SiN/$SiO_2$. It is recited that the SiON thin film is formed by thermal oxidation of the nitride film or LPCVD (Low Pressure Chemical Vapor Deposition), providing an excess in the Si component. It is also recited that the SiON thin film is capable of capturing charges more efficiently than SiN.

Non-Patent Document 2 discloses an ONO stack in which a nitrogen containing layer is present at an interface between the top oxide film and the nitride, in which the content of hydrogen atoms is decreased at the Si/$SiO_2$ interface by the nitrogen containing layer.

PRIOR ART DOCUMENTS

Patent Documents

[Patent Document 1] JP Patent Kokai Publication No. JP-P2005-159266A

[Patent Document 2] JP Patent Kokai Publication No. JP-A-9-115904

Non-Patent Documents

[Non-Patent Document 1] Szu-Yu Wang et al., 'Effect of fabrication process on the charge trapping behavior of SiON thin films', Solid-State Electronics, No. 50, 2006, p.1171-1174

[Non-Patent Document 2] Igor Levin et al., 'Structure, Chemistry and Electrical Performance of Silicon Oxide-Nitride-Oxide Stacks on Silicon', Journal of the Electrochemical Society, Vol. 151, No. 12, 2004, p. G833 to G838

[Non-Patent Document 3] Kazumasa Nomoto et al., 'Data retention improvement of metal-oxide-nitride-oxide-semiconductor memories using silicon tetrachloride-based silicon nitride with Ultralow Si—H bond density', Japanese Journal of Applied Physics, Vol. 43, No. 4B, 2004, p2211-2216

[Noi-Patent Document 4] Yen-Hao Shih et al., 'Highly reliable 2-bit/cell nitride trapping flash memory using a novel array-nitride-sealing (ANS) ONO process', 0-7803-9269-8/05/$20.00,USA, Institute of Electrical and Electronic Engineers (IEEE), 2005

[Non-Patent Document 5] G. Rosenman et al., 'Deep traps in oxide-nitride-oxide stacks fabricated from hydrogen and deuterium containing precursors', Journal of Applied Physics, 99, 023702, 2006

[Non-Patent Document 6] Yuji Yatsuda et al., 'Effects of high temperature hydrogen annealing on n-channel Si-Gate NMOS devices, Proc. 11th Conf. Solid State Devices, 1979, p. 219-224

[Non-Patent Document 7] Z. Liu et al., Hydrogen Distribution in Oxide-Nitride-Oxide Stacks and Correlation with Data Retention of MONOS Memoires', IEEE. Proc. of IRPS, 2008, pp. 705-706

[Non-Patent Document 8] Z. Liu et al., 'A hydrogen storage layer on the surface of silicon nitride films', Appl. Phys. Lett. 92, 192115 (2008)

SUMMARY

The disclosures of the above Patent Documents 1 and 2 and Non-Patent Documents 1 to 8 are incorporated herein by reference thereto.

An analysis of a related art by the present invention will be given below.

Meanwhile, as regards the relationship between the ONO stack and the hydrogen atoms, there are a theory which stands up for the necessity of hydrogen and a theory which opposes to the presence of hydrogen. The theory opposing hydrogen states that hydrogen atoms adversely affect electron trapping and hence should be excluded from the ONO stack (Non-Patent Documents 3 and 4). The theory for the hydrogen necessity states that the hydrogen atoms contribute to electron trapping and hence are needed in the ONO stack (see Non-Patent Documents 5 and 6).

The related techniques, mentioned above, represent an improvement based on the theory which opposes to hydrogen, and decrease the hydrogen concentration in the ONO stack so as to decrease the quantity of electrons trapped in the ONO stack for reducing variations in the quantities of trapped electrons. There is however a fear that a preset level of a threshold value Vt of a transistor cannot be secured. On the other hand, in accordance with the theory for the hydrogen necessity, the preset level of the threshold value Vt of the transistor can be secured by securing the hydrogen concentration in the ONO stack. However, in this case, the quantity of electrons trapped in the ONO stack tends to be varied, thus possibly leading to variations in the threshold value Vt of the transistor. There is thus a room for improving the ONO stack so that both of the two theories will be taken into account.

It is therefore an object of the present invention to improve a gate insulating film (tunnel insulating film) in a memory cell to render the device operation more reliable.

In a first aspect of the present invention, there is provided a semiconductor memory in which an insulating film is interposed between a silicon substrate and a gate electrode. The insulating film is a stack of a first silicon oxide film, a silicon nitride film and a second silicon oxide film, arrayed in this order from the side the silicon substrate. A hydrogen occluding film is interposed on at least one or all of interfaces between the first silicon oxide film and the silicon nitride film, between the silicon nitride film and the second silicon oxide film and between the second silicon oxide film and the gate electrode.

In a second aspect of the present invention, there is provided a semiconductor memory in which an insulating film is interposed between a silicon substrate and a gate insulating film. The insulating film is a stack of a first silicon oxide film, a silicon nitride film and a second silicon oxide film, arrayed in this order from the side the silicon substrate. A hydrogen occluding film is interposed on each of an interface between the silicon nitride film and the second silicon oxide film and an interface between the second silicon oxide film and the gate electrode.

In the semiconductor memory according to the present invention, the hydrogen occluding film is preferably a silicon oxy-nitride film containing $Si_2N_2O$.

In the semiconductor memory according to the present invention, the hydrogen concentration of the hydrogen occluding film is preferably higher than $3 \times 10^{19}$ atom/cm$^3$.

In a third aspect of the present invention, there is provided a method for manufacturing a semiconductor memory comprising the steps of: forming a silicon oxide film on a surface of a silicon substrate; and nitriding the silicon oxide film to form a silicon oxy-nitride film containing $Si_2N_2O$.

In a fourth aspect of the present invention, there is provided a method for manufacturing a semiconductor memory comprising the steps of: forming a silicon nitride film on a surface of a silicon oxide film; and oxidizing the silicon nitride film to form a silicon oxy-nitride film containing $Si_2N_2O$.

In a fifth aspect of the present invention, there is provided a method for manufacturing a semiconductor memory comprising the steps of: nitriding a surface of a silicon oxide film to form a silicon oxynitride film containing $Si_2N_2O$; and forming a silicon oxide film on the silicon oxy-nitride film.

In a sixth aspect of the present invention, there is provided a method for manufacturing a semiconductor memory comprising the steps of: forming a first silicon oxide film on a surface of a silicon substrate; forming a silicon nitride film on the first silicon oxide film; oxidizing the surface of the silicon nitride film to form a first silicon oxy-nitride film containing $Si_2N_2O$; and forming a second silicon oxide film and a second silicon oxy-nitride film containing $Si_2N_2O$, in this order from the side the first silicon oxy-nitride film between the silicon nitride film and the first silicon oxy-nitride film.

In the step of forming the first silicon oxy-nitride film, in the method for manufacturing the semiconductor memory according to the present invention, the surface of the silicon nitride film is preferably exposed to atmosphere, and the silicon nitride film is preferably annealed in $N_2$ or Ar atmosphere at a temperature not lower than 900° C. and not higher than 1150° C. to form the first silicon oxy-nitride film.

In the method for manufacturing a semiconductor memory according to the present invention, the step of forming the second silicon oxide film and the step of forming the second silicon oxy-nitride film are preferably carried out by wet oxidization using a gas containing $H_2/O_2$ to form the second silicon oxide film and the second silicon oxy-nitride film.

In the method for manufacturing a semiconductor memory according to the present invention, the residence time in atmosphere after forming the first silicon oxy-nitride film until forming the second silicon oxide film and the second silicon oxy-nitride film is preferably not more than 7 hours.

The meritorious effects of the present invention are summarized as follows.

According to the present invention, in which a hydrogen occluding film(s) is interposed at an interface(s) of an ONO stack, arranged between a silicon substrate and a gate electrode, hydrogen diffusion to the silicon oxide film disposed on the silicon substrate surface is blocked, while hydrogen contributing to trapping of electrons may be immobilized in a stabile state at the location of the interface(s). As a result, deterioration of trapping of electrons otherwise caused by rewriting may be eliminated to suppress variations in shifting of the threshold voltage Vt caused by readout stress. It is possible to suppress deterioration of retention following rewriting of an ONO type non-volatile memory or RDT deterioration (deterioration of a threshold voltage). Since the SiON layer is capable of blocking hydrogen, it is possible to suppress diffusion of free hydrogen into the underlying oxide film.

PREFERRED MODES

Figure 1A:
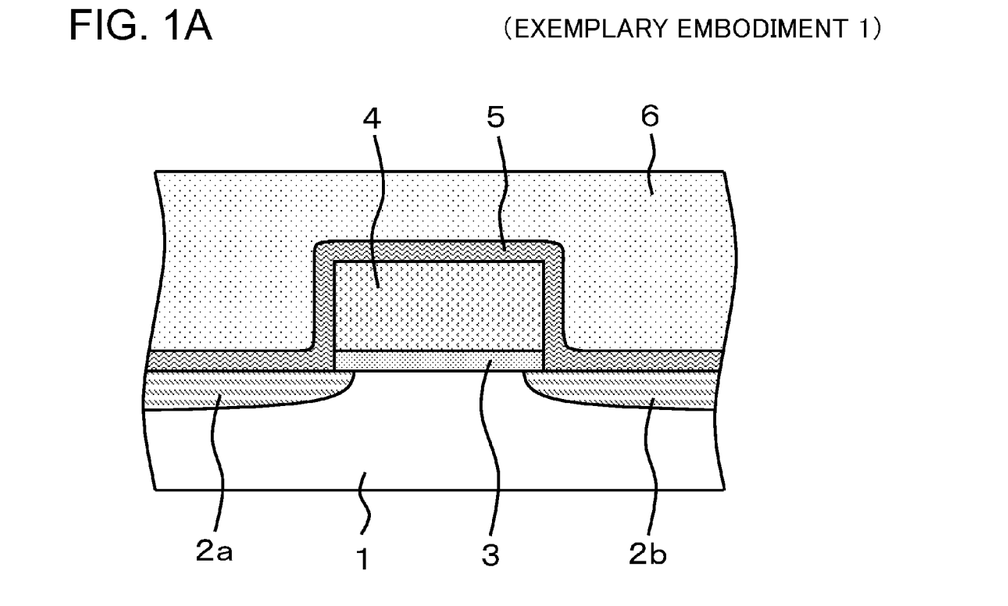
FIG. 1A is a schematic partial cross-sectional view showing a formulation of a memory cell in a semiconductor memory according to Exemplary embodiment 1 of the present invention.
Figure 1B:
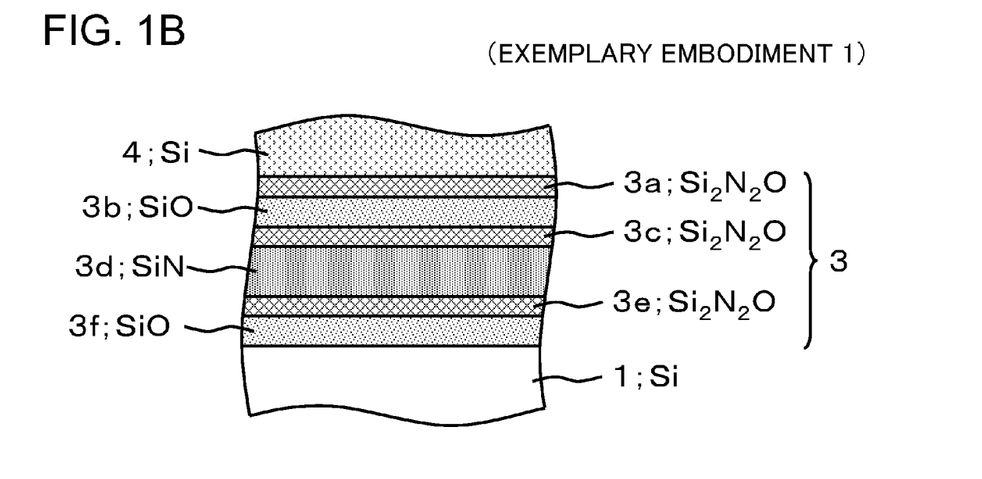
FIG. 1B is an enlarged cross-sectional view of a gate insulating film.

A semiconductor memory according to a mode of the present invention, an insulating film (3 of FIG. 1B) is interposed between a silicon substrate (1 of FIG. 1B) and a gate electrode (4 of FIG. 1B). The insulating film is a stack of a first silicon oxide film (3f of FIG. 1B), a silicon nitride film (3d of FIG. 1B) and a second silicon oxide film (3b of FIG. 1B), arrayed in this order from the side of the silicon substrate. A hydrogen occluding film(s) (3a, 3c, 3e of FIG. 1B) are interposed on at least one or all of interfaces between the first silicon oxide film (3f of FIG. 1B) and the silicon nitride film (3d of FIG. 1B), between the silicon nitride film (3d of FIG. 1B) and the second silicon oxide film (3b of FIG. 1B), and between the second silicon oxide film (3b of FIG. 1B) and the gate electrode (4 of FIG. 1B)

EXEMPLARY EMBODIMENT 1

A semiconductor memory according to Exemplary embodiment 1 of the present invention is now described with reference to the drawings. FIG. 1A is a schematic partial cross-sectional view showing a formulation of a memory cell in a semiconductor memory according to Exemplary embodiment 1 of the present invention, and FIG. 1B is an enlarged cross-sectional view of a gate insulating film.

Referring to FIG. 1A, the memory cell of the semiconductor memory according to Exemplary embodiment 1 includes a silicon substrate 1, such as a P-type silicon substrate. The silicon substrate 1 includes a channel (region) on both sides of which there are formed a source region 2a and a drain region 2b. In both of these regions, there are diffused impurities, such as phosphorus. A gate electrode 4 of, for example, polysilicon, is deposited, via a gate insulating film 3 (tunnel insulating film) on top of the channel. The entire memory cell, inclusive of the gate electrode 4, source region 2a and the drain region 2b (for instance), is covered by a cover film 5, such as a silicon nitride film. An interlayer insulating film 6, such as a silicon oxide film, is formed on top of the cover film 5. The gate electrode 4 is electrically connected to a word line, not shown, via a via and a conductor. The drain region 2b is electrically connected to a bit line, also not shown, via a via and a conductor, and the source region 2a is electrically connected to a source line, also not shown, via a via and a conductor (wiring). It is noted that the transistor formulation of the memory cell shown in FIG. 1A is merely illustrative and may be provided with a floating gate or may also be a capacitor.

Referring to FIG. 1B, the gate insulating film 3 (tunnel insulating film) is an insulating film interposed between the silicon substrate 1 and the gate electrode 4. The gate insulating film 3 is composed of a silicon oxide film 3f, a hydrogen occluding film 3e, a silicon nitride film 3d, a hydrogen occluding film 3c, a silicon oxide film 3b and a hydrogen occluding film 3a, piled up in this order looking from the lower layer side. The gate insulating film 3 has a steep hydrogen concentration gradient such that the hydrogen concentration decreases acutely in directions away from the hydrogen occluding films 3a, 3c and 3e.

The hydrogen occluding film 3a is a film that contains occluded hydrogen. The hydrogen occluding film 3a contains more hydrogen atoms than the silicon oxide film 3b. The hydrogen concentration of the hydrogen occluding film 3a may be increased on heating. The hydrogen occluding film 3a, containing occluded hydrogen, has the function of blocking hydrogen from the silicon oxide film 3b and inhibits hydrogen atoms from passing to the side of the gate electrode 4. The film thickness of the hydrogen occluding film 3a is, for instance, more than 0 nm and lesser than 3 nm. The hydrogen occluding film 3a is a silicon oxy-nitride film containing $Si_2N_2O$, with the hydrogen concentration in the film preferably exceeding $3\times10^{19}$ atom/cm$^3$, more preferably exceeding $8\times10^{19}$ atom/cm$^3$. Meanwhile, $Si_2N_2O$ represents a compound of Si, N and O with the proportions of Si to N to O being 2:2:1.

The silicon oxide film 3b is a film formed, for instance, by a wet oxidizing method in a ($H_2+O_2$) atmosphere. The hydrogen concentration of the silicon oxide film 3b is lower than that of the hydrogen occluding film 3a or the hydrogen occluding film 3c because hydrogen atoms in the silicon oxide film 3b are attracted (drawn) into the bulk of the hydrogen occluding film 3a or the hydrogen occluding film 3c.

The hydrogen occluding film 3c is a film containing occluded hydrogen atoms. The hydrogen occluding film 3c contains more hydrogen atoms than the silicon oxide film 3b or the silicon nitride film 3d. The hydrogen concentration of the hydrogen occluding film 3c may be increased on heating. The hydrogen occluding film 3c has the function of blocking the movement of hydrogen atoms between the silicon oxide film 3b and the silicon nitride film 3d. The film thickness of the hydrogen occluding film 3c is, for instance, larger than 0 nm and lesser than 3 nm. The hydrogen occluding film 3c is a silicon oxy-nitride film containing $Si_2N_2O$, with the hydrogen concentration in the film preferably exceeding $3\times10^{19}$ atom/cm$^3$, more preferably exceeding $8\times10^{19}$ atom/cm$^3$.

The silicon nitride film 3d is formed by a CVD (Chemical Vapor Deposition) method, using silane and ammonia as feedstock gases. The hydrogen concentration of the silicon nitride film 3d is lower than that of the hydrogen occluding film 3c or 3e because hydrogen atoms in the silicon nitride film 3d are attracted (drawn) by the hydrogen occluding films 3c and 3e.

The hydrogen occluding film 3e is a film containing occluded hydrogen atoms. The hydrogen occluding film 3e contains more hydrogen atoms than the silicon oxide film 3f or the silicon nitride film 3d. The hydrogen concentration of the hydrogen occluding film 3e may be increased on heating. The hydrogen occluding film 3e has the function of blocking the movement of hydrogen atoms into the silicon nitride film 3d. The film thickness of the hydrogen occluding film 3c is, for instance, larger than 0 nm and lesser than 3 nm. The hydrogen occluding film 3c is a silicon oxy-nitride film containing $Si_2N_2O$, with the hydrogen concentration in the film preferably exceeding $3\times10^{19}$ atom/cm$^3$ more preferably exceeding $8\times10^{19}$ atom/cm$^3$.

The silicon oxide film 3f is a film formed i.e., by thermally oxidizing a surface part of the silicon substrate 1. The hydrogen concentration of the silicon oxide film 3f is lower than that of the hydrogen occluding film 3e because hydrogen atoms in the silicon oxide film 3f are attracted (drawn) into the hydrogen occluding film 3e.

In FIG. 1B, the hydrogen occluding film 3e is interposed on the interface between the silicon oxide film 3f and the silicon nitride film 3d. The hydrogen occluding film 3c is interposed on the interface between the silicon nitride film 3d and the silicon oxide film 3b, while the hydrogen occluding film 3a is interposed on the interface between the silicon oxide film 3b and the gate electrode 4. However, the film(s) containing occluded hydrogen may be interposed on one or two of the three interfaces as far as it is then still possible to attract (draw) hydrogen atoms in (from) the silicon oxide films 3b, 3f and in (from) the silicon nitride film 3d.

As regards the method for manufacturing the hydrogen occluding film 3a (silicon oxy-nitride film containing $Si_2N_2O$), the hydrogen occluding film 3a may be obtained by oxidizing a surface part of the silicon nitride film 3d by ($N_2+O_2$) annealing, or by oxidization with the $O_3$ oxidization or with dry oxidization followed by the ISSG (In Situ Stream Generated) oxidization. The oxidizing temperature may approximately range from 900° C. to 1050° C. and, in the case of the $O_3$ oxidization, the oxidizing temperature may approximately range from 400° C. to 1050° C. The oxidizing pressure may be several torr to not higher than 11 atm.

As regards the method for manufacturing the hydrogen occluding film 3c (silicon oxy-nitride film containing $Si_2N_2O$), when a surface part of the silicon nitride film 3d is oxidized in a ($H_2+O_2$) atmosphere by a wet oxidization method to form the silicon oxide film 3b, the hydrogen occluding film 3c is formed on the interface between the silicon oxide film 3b and the silicon nitride film 3d. The wet oxidization temperature may approximately range from 800° C. to 1000° C. The pressure used during the oxidization may approximately range from 1 torr to not higher than 500 torr. The flow ratio of $H_2/O_2$ may be not less than 0.004 to not higher than 0.4, preferably not less than 0.05 to not higher than 0.33.

As regards the method for manufacturing the hydrogen occluding film 3e (silicon oxy-nitride film containing $Si_2N_2O$), the silicon oxide film 3f is first formed and then annealed at a temperature, e.g., of 400° C. to 1050° C. at a pressure, e.g., of several torr to not higher than 11 atm. to yield the hydrogen occluding film 3e. Or, the silicon oxide film 3f is first formed and then heat-treated at a pressure of several torr to not higher than 11 atm. using a precursor containing nitrogen components (e.g., $NH_3$, $N_2O$ or $NO$) to yield the hydrogen occluding film 3e.

It has been experimentally found by the present inventor that the films containing occluded hydrogen 3a, 3c and 3e are silicon oxy-nitride films containing $Si_2N_2O$. It has also been found by the present inventor that the $Si_2N_2O$ has the function of occluding hydrogen atoms and an extremely low transmittance for hydrogen and oxygen atoms. It is noted that the value of this transmittance depends on the proportion of oxygen and nitrogen. If heating is carried out at 700° C. or higher, hydrogen atoms are expelled from $SiO_2$ or $Si_3N_4$, but hydrogen is drawn/absorbed by $Si_2N_2O$.

In the ONO structure, stated in Patent Document 1, an oxide nitride presumably exists on an interface between the top oxide film and the nitride film. However, since this oxide nitride has been formed by rapid thermal oxidation in an atmosphere containing a radical oxidant, the oxide-nitride is rich in oxygen components and low in hydrogen concentration. It may thus be considered that the oxide nitride is not capable of attracting/drawing out hydrogen atoms contained in the nitride film.

Meanwhile, in Patent Document 1 a bottom oxide film and a nitride film are first formed on a substrate, then patterned and heated at a temperature of 900° C. to 1150° C., by way of a heating step. The resulting product is then rapidly thermally oxidized in an atmosphere containing a radical oxidant, by way of a radical oxidization step, to form a product having a patterned surface and presenting an oxide film on its sidewall section. It is recited that this shortens the processing time and yields a reliable ONO structure with a reduced thermal load. Meanwhile, Patent Document 1 states the conditions for the radical oxidization step mainly in connection with the growth of the top oxide film, however, there lacks the description of the atmosphere used during the heating step. Patent Document 1 also recites that, while the ultimate structure of a trap unit is the ONO structure, it is mainly the nitride film that captures electrical charges.

It should be noted that the silicon oxide film, stated in Patent Document 2, is nitrided or oxidized by heat treatment at a temperature of not lower than 900° C. in an atmosphere of nitrogen monoxide or dinitrogen monoxide. Hence, the resultant film is presumably depleted of hydrogen, so that the film may not be capable of attracting hydrogen atoms. On the other hand, in Non-Patent Document 1, a top oxide film, obtained on high temperature oxidation (HTO), is formed on top of the SiON thin film. Hence, the SiON thin film is again presumably depleted of hydrogen, so that it may again not be capable of attracting hydrogen atoms. In Non-Patent Document 2, in which the top oxide film is processed with steam at 1000° C., or tetraethoxysilane (TEOS) thermally processed at 670° C., the nitrogen containing layer in the top oxide film is presumably depleted, in the similar manner, of hydrogen. Thus, the top oxide film may also not be capable of attracting hydrogen atoms.

On the other hand, the hydrogen occluding films 3a, 3c and 3e of Exemplary embodiment 1 are silicon oxy-nitride films containing $Si_2N_2O$, and possess the function of occluding hydrogen atoms. The hydrogen concentration in these films exceeds $3 \times 10^{19}$ atom/cm$^3$. On heating to 700° C. or higher, hydrogen atoms are expelled from $SiO_2$ and $Si_3N_4$, however, $Si_2N_2O$ absorbs hydrogen. Thus, hydrogen atoms from the silicon oxide films 3b, 3f and the silicon nitride film 3d are occluded in the hydrogen occluding films 3a, 3c and 3e. The oxidenitride disclosed in Patent Document 1, the nitride oxide part in the silicon oxide film, disclosed in Patent Document 2, the SiON thin film, disclosed in Non-Patent Document 1 or the nitrogen containing layer in the top oxide film, disclosed in Non-Patent Document 2, are lacking in this hydrogen occluding property, and hence may be construed to differ from the hydrogen occluding films 3a, 3c and 3e of Exemplary embodiment 1 (silicon oxynitride films containing $Si_2N_2O$).

With Exemplary embodiment 1, the hydrogen occluding films 3a, 3c and 3e possess the function of drawing/absorbing sucking hydrogen atoms to suppress diffusion of the hydrogen atoms in the silicon oxide films 3b, 3f and in the silicon nitride film 3d. As a result, variations in the hydrogen concentration in the gate insulating film 3 and variations in the quantities of electrons captured in the gate insulating film 3 may be suppressed to improve reliability of the semiconductor memory operation. That is, diffusion of free hydrogen atoms by rewriting may be suppressed in the bottom side silicon oxide film 3f, while stable hydrogen atoms, indispensable for electron capturing in the silicon nitride film 3d, may be held by the hydrogen occluding films 3c, 3e. Hence, the semiconductor memory may withstand the stress of the write and erase operations to realize stabilized operations.

EXEMPLARY EMBODIMENT 2

Figure 2A:
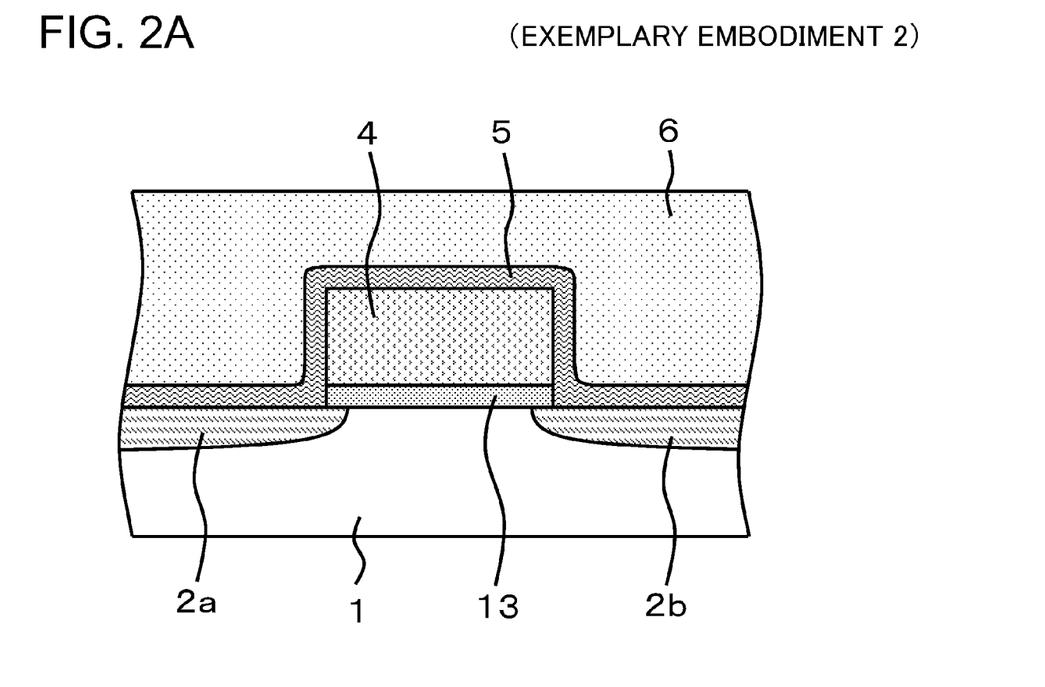
FIG. 2A is a schematic cross-sectional view, similar to FIG. 1A, showing a formulation of a memory cell in a semiconductor memory according to Exemplary embodiment 2 of the present invention.

A semiconductor memory according to Exemplary embodiment 2 of the present invention is now described with reference to the drawings. FIG. 2A is a schematic cross-sectional view showing a formulation of a memory cell in a semiconductor memory according to Exemplary embodiment 1 of the present invention, and FIG. 2B is an enlarged cross-sectional view of a gate insulating film.

This Exemplary embodiment 2 differs from Exemplary embodiment 1 in that a hydrogen occluding film, corresponding to the film 3e of FIG. 1B, is not provided between a silicon oxide film 13f and a silicon nitride film 13d. The silicon oxide film 13f is to be a bottom oxide film of the gate insulating film 13. Exemplary embodiment 2 also differs from Exemplary embodiment 1 as regards the method of forming the hydrogen occluding film 13c, silicon oxide film 13b and the hydrogen occluding film 13a.

Referring to FIG. 2A, the memory cell of the semiconductor memory according to Exemplary embodiment 2 includes a silicon substrate 1, such as a P-type silicon substrate. The silicon substrate 1 includes a channel (region) on both sides of which there are formed a source region 2a and a drain region 2b, for instance. In these regions 2a, 2b, there are diffused impurities, such as phosphorus. A gate electrode 4 of, for example, polysilicon, is deposited, via a gate insulating film 13 (tunnel insulating film) on top of the channel. The entire memory cell, inclusive of the gate electrode 4, source region 2a and the drain region 2b, is covered by a cover film 5, such as a silicon nitride film. An interlayer insulating film 6, such as a silicon oxide film, is formed on top of the cover film 5. The gate electrode 4 is electrically connected to a word line, not shown, via a via and a conductor. The drain region 2b is electrically connected to a bit line, not shown, through a via and a conductor, and the source region 2a is electrically connected to a source line, not shown, through a via and a conductor. It is noted that the transistor formulation of the memory cell shown in FIG. 2A is merely illustrative and may be provided with a floating gate or may also be a capacitor.

Figure 2B:
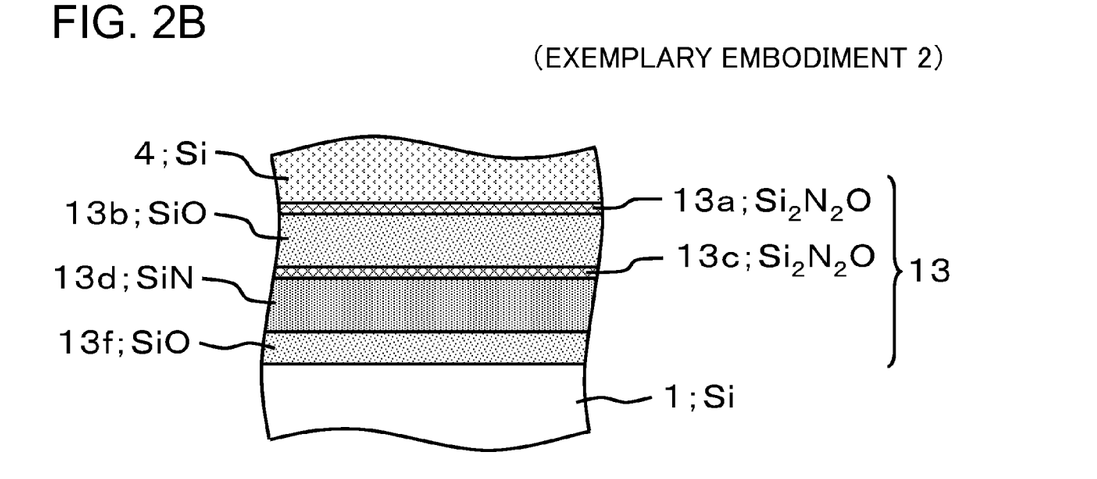
FIG. 2B is an enlarged cross-sectional view, similar to FIG. 1B, showing a gate insulating film.

Referring to FIG. 2B, the gate insulating film 13 (tunnel insulating film) is an insulating film interposed between the silicon substrate 1 and the gate electrode 4. The gate insulating film 13 is composed of a silicon oxide film 13f, a silicon nitride film 13d, a hydrogen occluding film 13c, a silicon oxide film 13b and a hydrogen occluding film 13a, piled up in this order looking from the lower layer side. The gate insulating film 13 has a steep hydrogen concentration gradient such that the hydrogen concentration decreases acutely in directions away from the hydrogen occluding films 13a and 13c.

The hydrogen occluding film 13a is a film that contains occluded hydrogen. The hydrogen occluding film 13a contains more hydrogen atoms than the silicon oxide film 13b. The hydrogen concentration of the hydrogen occluding film 13a may be increased on heating. The hydrogen occluding film 13a, containing occluded hydrogen atoms, has the function of blocking hydrogen from the silicon oxide film 13b and inhibits hydrogen atoms from passing to the side of the gate electrode 4. The film thickness of the hydrogen occluding film 13a is, for instance, more than 0 nm and not more than 3 nm. The hydrogen occluding film 13a is a silicon oxy-nitride film containing $Si_2N_2O$, with the hydrogen concentration in the film exceeding $3 \times 10^{19}$ atom/cm$^3$, preferably exceeding $8 \times 10^{19}$ atom/cm$^3$. Meanwhile, $Si_2N_2O$ represents a compound of Si, N and O with the ratio of Si to N to O being substantially 2:2:1.

The hydrogen concentration of the silicon oxide film 13b is lower than that of the hydrogen occluding film 13a or the hydrogen occluding film 13c because hydrogen atoms in the silicon oxide film 13b are attracted drawn out by the hydrogen occluding film 13a and the hydrogen occluding film 13c.

The hydrogen occluding film 13c is a film containing occluded hydrogen atoms. The hydrogen occluding film 13c contains more hydrogen atoms than the silicon oxide film 13b or the silicon nitride film 13d. The hydrogen concentration of the hydrogen occluding film 13c may be increased on heating. The hydrogen occluding film 13c has the function of blocking the movement of hydrogen atoms between the silicon oxide film 13b and the silicon nitride film 13d. The film thickness of the hydrogen occluding film 13c is larger than 0 nm and not less than 3 nm, for instance. The hydrogen occluding film 13c is a silicon oxy-nitride film containing $Si_2N_2O$, with the hydrogen concentration in the film preferably exceeding $3 \times 10^{19}$ atom/cm$^3$, more preferably exceeding $8 \times 10^{19}$ atom/cm$^3$.

Otherwise, Exemplary embodiment 2 is similar to Exemplary embodiment 1.

Figure 3:
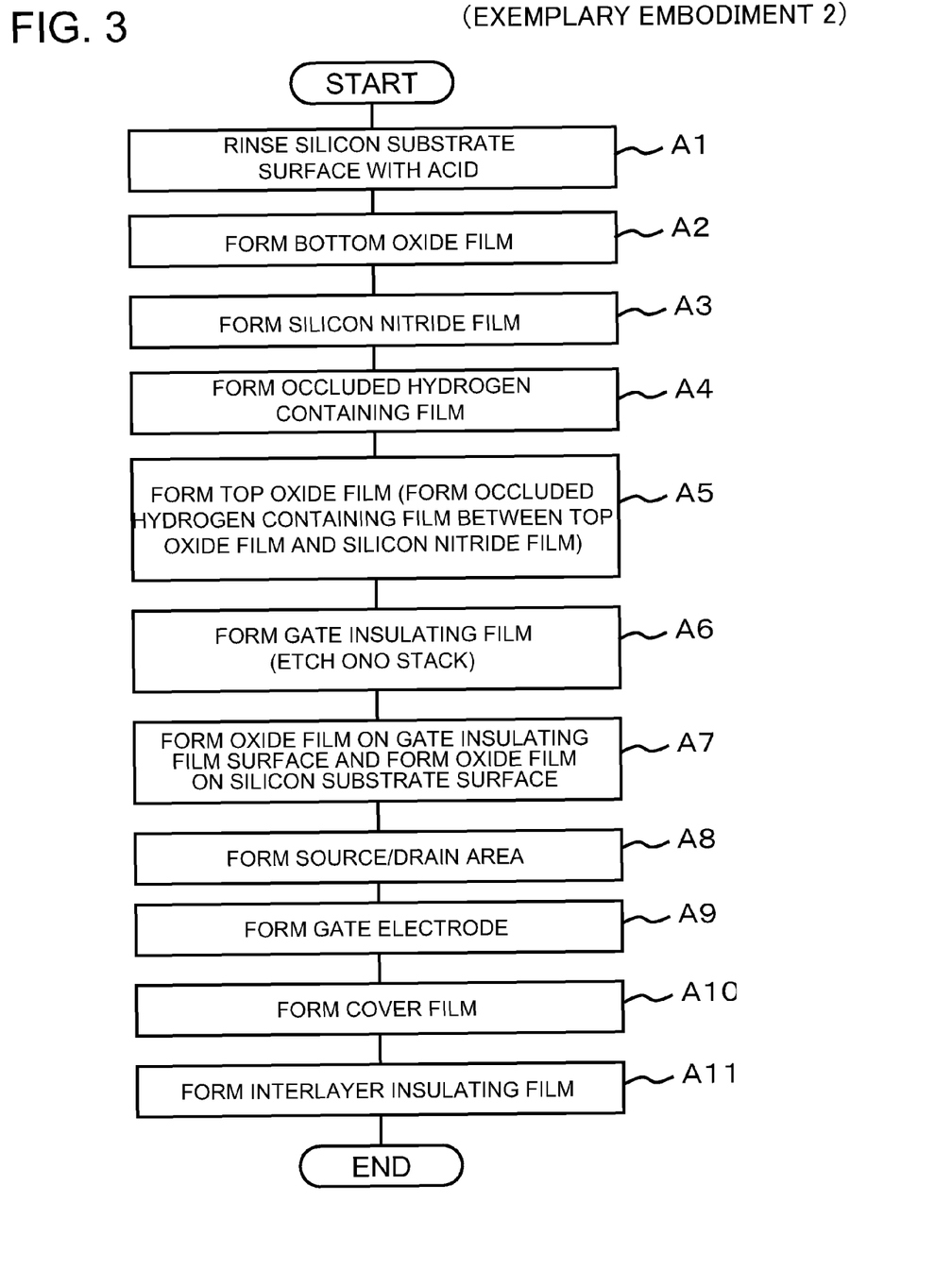
FIG. 3 is a flowchart schematically showing a method for manufacturing a semiconductor memory according to Exemplary embodiment 2 of the present invention.
Figure 4A:
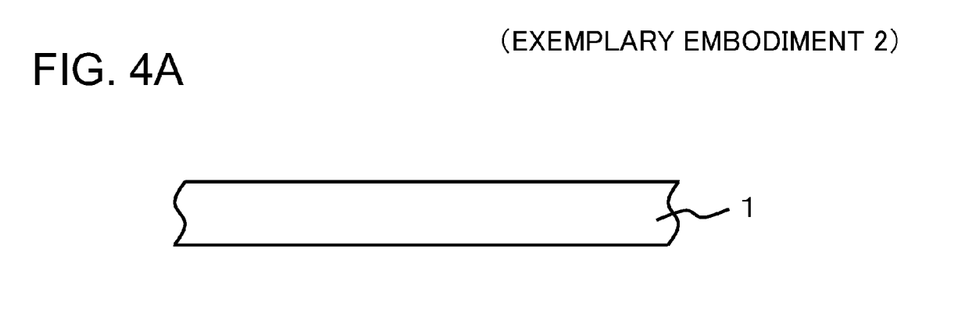
FIGS. 4A to 4D are cross-sectional views schematically showing a first step of the method for manufacturing the semiconductor memory according to Exemplary embodiment 2 of the present invention.
Figure 4B:
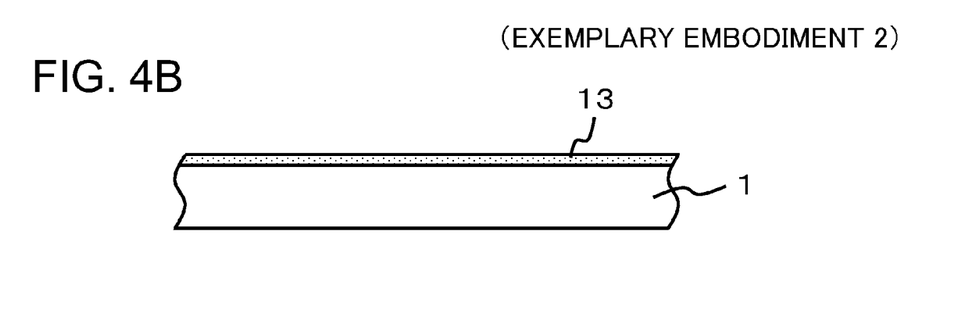
Figure 4C:
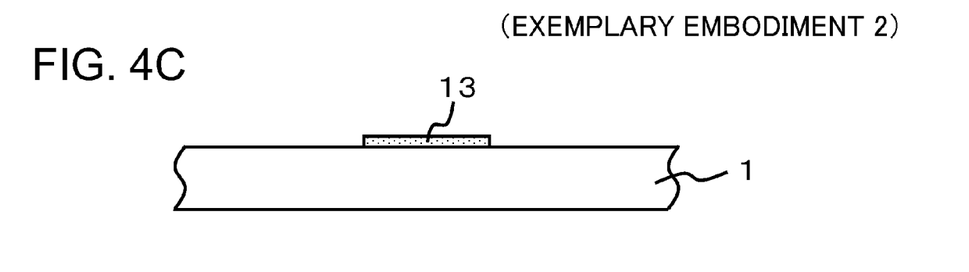
Figure 4D:
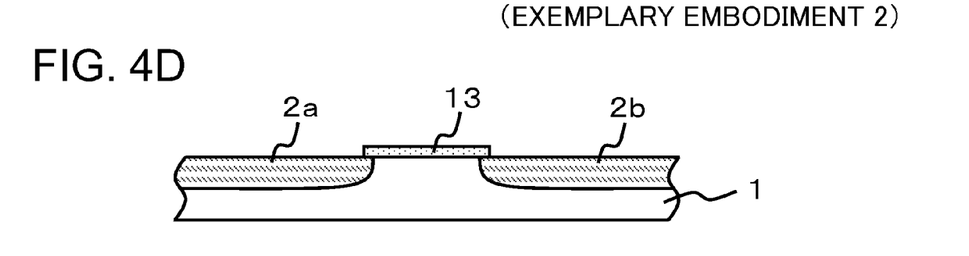
Figure 5A:
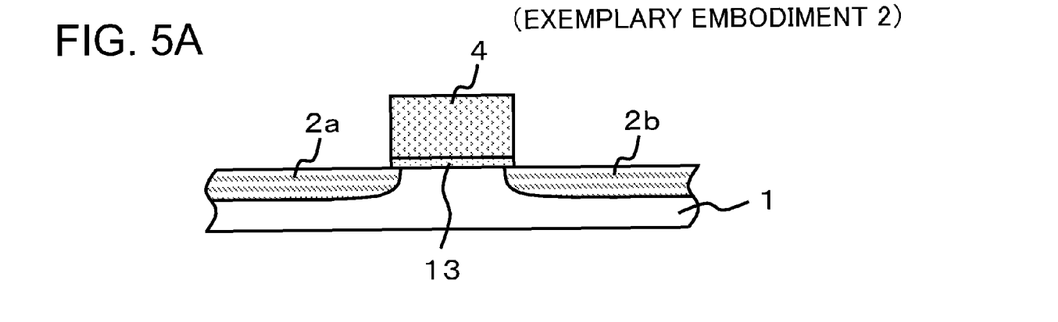
FIGS. 5A to 5C are cross-sectional views schematically showing a second step of the method for manufacturing the semiconductor memory according to Exemplary embodiment 2 of the present invention.
Figure 5B:
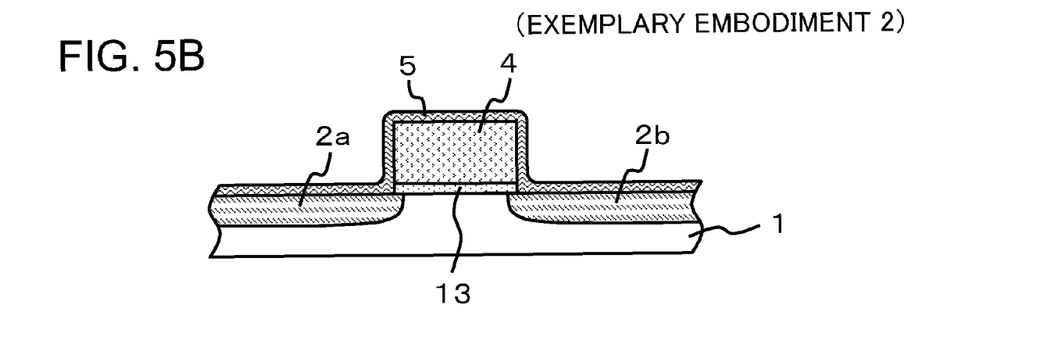
Figure 5C:
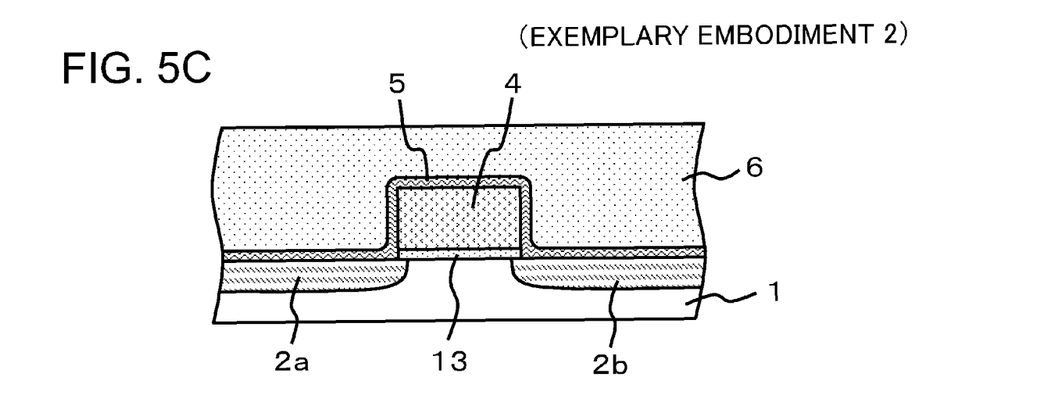

A semiconductor memory according to Exemplary embodiment 2 of the present invention is now described with reference to the drawings. FIG. 3 depicts a flowchart schematically showing a method for manufacturing the semiconductor memory of Exemplary embodiment 2 of the present invention FIGS. 4 and 5 are schematic cross-sectional views for illustrating process steps of the method for manufacturing the semiconductor memory of Exemplary embodiment 2 of the present invention. FIG. 6 is a schematic cross-sectional view for illustrating process steps of the method for manufacturing the ONO stack in the semiconductor memory of Exemplary embodiment 2 of the present invention.

Initially, the surface of the silicon substrate 1 is washed with an acid (step A1). See FIG. 3 and FIG. 4A. This removes a native oxide film on the surface of a silicon substrate 1.

A silicon oxide film 13f, which is dedicated to be a bottom oxide film, is then formed on the silicon substrate 1 (step A2). See FIG. 3 and FIG. 6A. It is noted that the silicon oxide film 13f may be formed by thermal oxidation of the silicon substrate 1, for instance.

A silicon nitride film 13d then is formed on the silicon oxide film 13f (step A3). See FIG. 3 and FIG. 6B. It is noted that the silicon nitride film 13d may be formed by the CVD method, using silane and ammonia, for example, as feedstock gases.

A hydrogen occluding film 13a then is formed on the silicon nitride film 13d (step A4). See FIG. 3 and FIG. 6C.

Figure 6A:
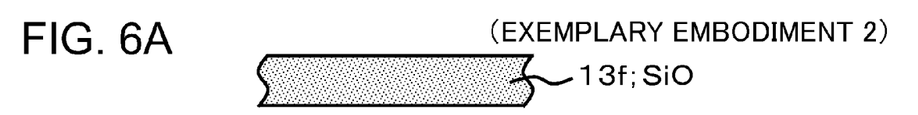
FIGS. 6A to 6E are cross-sectional views schematically showing steps for manufacturing an ONO stack in the semiconductor memory according to Exemplary embodiment 2 of the present invention.
Figure 6B:
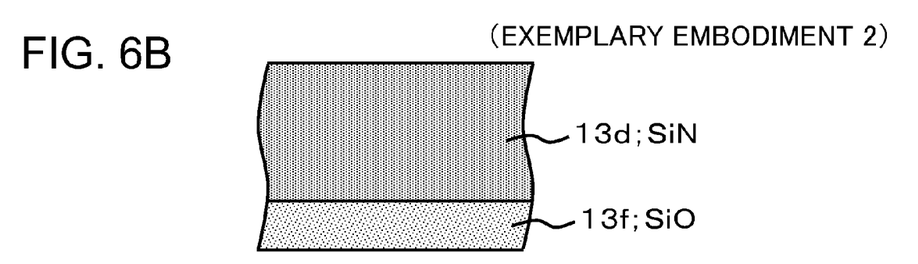
Figure 6C:
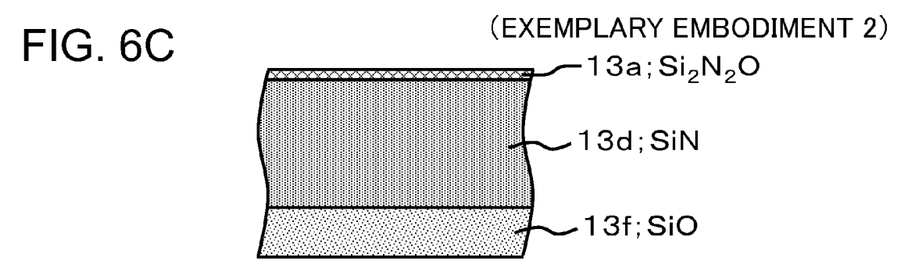

Meanwhile, the hydrogen occluding film 13a is capable of storing hydrogen in a stabile state, and is to be a diffusion barrier layer capable of controlling the rate of oxygen diffusion. Also the hydrogen occluding film 13a plays the role of adjusting the partial pressure of oxygen delivered to the silicon nitride film 13d.

The hydrogen occluding film 13a is formed as follows: Initially, the surface of the silicon nitride film 13d is contacted once with atmosphere and annealed, that is, processed with heating, at a temperature of 900° C. to 1150° C., in an $N_2$ atmosphere, to form the hydrogen occluding film 13a (silicon oxy-nitride film containing $Si_2N_2O$) on the surface of the silicon nitride film 13d. An Ar atmosphere may be used in place of the $N_2$ atmosphere. The silicon nitride film is annealed in the $N_2$ atmosphere since it then becomes possible to restrict the quantity of oxygen entrained into the silicon nitride film 13d to a level of not higher than $6 \times 10^{14}$ atom/cm$^2$. It is noted that the film thickness of the hydrogen occluding film 13a is lesser than 3 nm, for instance.

The hydrogen occluding film 13c (silicon oxy-nitride film containing $Si_2N_2O$) and the silicon oxide film 13b are then formed between the silicon nitride film 13d and the hydrogen occluding film 13a in this order looking from the side of silicon nitride film 13d (step A5). See FIG. 3 and FIG. 6E. This completes an ONO stack used as the gate insulating film 13, as shown in FIG. 4B.

Figure 6D:
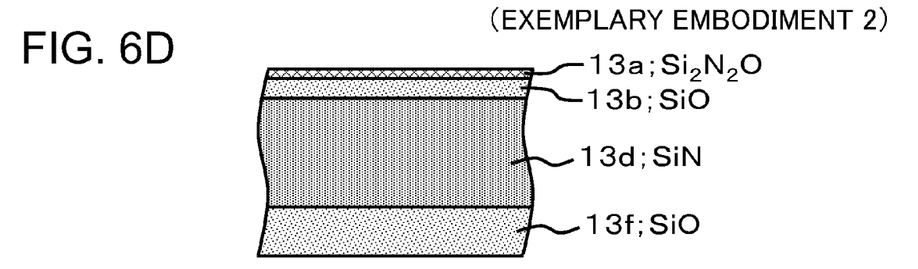
Figure 6E:
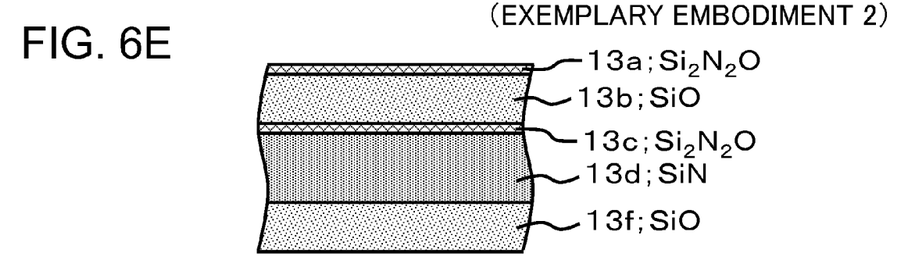

The hydrogen occluding film 13c and the silicon oxide film 13b can be formed by wet oxidization of the silicon nitride film 13d with an optimized H2/O2 gas flow ratio. It is noted that the hydrogen occluding film 13a, formed on the surface of the silicon nitride film 13d, operates as a diffusion barrier layer capable of controlling the rate of oxygen diffusion The hydrogen occluding film 13a can be generated only under a predetermined oxygen partial pressure. Thus, to control the oxygen partial pressure, the hydrogen occluding film 13a is formed at step A4 on the surface of the silicon nitride film 13d, and the quantity of oxygen to be diffused into the silicon nitride film 13d is controlled at step A5. In the wet oxidation of the silicon nitride film 13d, oxygen atoms pass through the hydrogen occluding film 13a to get to the silicon nitride film 13d, where oxygen reacts with the silicon nitride film 13d to form the silicon oxide film 13b which is to form the top oxide film, as shown in FIG. 6D. By-produced nitrogen passes through the hydrogen occluding film 13a to exit to outside. As the silicon oxide film 13b grows in thickness, the concentration of oxygen, supplied to the silicon nitride film 13d, is lowered. Thus, as shown in FIG. 6E, the hydrogen occluding film 13c is formed between the silicon oxide film 13b and the silicon nitride film 13d. It is noted that, in the wet oxidation of the silicon nitride film 13d, the hydrogen occluding film 13a, operating as a cap, is left without vanishing. Preferably, the residence time in atmosphere in the course of the steps A4 and A5 is 7 hours or less.

The gate insulating film 13 of a preset gate length is then formed by patterning (step A6). See FIG. 3 and FIG. 4C. This exposes the silicon substrate 1 in a region other than the gate insulating film 13. It is noted that the gate insulating film 13 may be formed by etching an excess portion of the ONO stack using a photoresist.

An oxide film is then formed on the surfaces of the gate insulating film 13 and the silicon substrate 1 (step A7). See FIG. 3. Meanwhile, the oxide film may be formed by thermal oxidation.

Then, using the gate insulating film 13 as a mask, the source region 2a and the drain region 2b are formed on the silicon substrate 1 (step A8). See FIG. 3 and FIG. 4D. Meanwhile, the source region 2a and the drain region 2b are formed by ion implantation, for instance.

The gate electrode 4 then is formed on the gate insulating film 13 (step A9). See FIG. 3 and FIG. 5A. Meanwhile, in forming the gate electrode 4, a polysilicon film, which is to be the gate electrode 4, is formed on the silicon substrate 1, on which the gate insulating film 13, the source region 2a and the drain region 2b are already formed. Then, using a photoresist, excess polysilicon is etched off to complete the gate electrode.

A cover mask 5, such as a silicon nitride film, is then formed on the silicon substrate 1, on which the gate electrode 4, source region 2a and the drain region 2b are already formed (step A10). See FIG. 3 and FIG. 5B.

An interlayer insulating film 6, such as a silicon oxide film, is then formed on the cover film 5 (step A11). See FIG. 3 and FIG. 5C. This completes a semiconductor memory similar to that shown in FIG. 2.

With Exemplary embodiment 2, the stable hydrogen occluding film 13c may be formed on the interface between the silicon oxide film 13b, which is to be a top oxide film, and the silicon nitride film 13d. This suppresses the quantity of trapped electrons from increasing, and restricts diffusion of hydrogen atoms in/into the silicon nitride film 13d, thus providing the semiconductor memory of high reliability.

The present invention is based on claiming the priority (internal priority) of our earlier patent application No. 2008-096373 filed on Apr. 2, 2008. The entire contents of disclosure of this patent application of the earlier filing date are incorporated herein by reference thereto. After the filing of the patent application of the earlier filing date, the following matter has been disclosed by the inventors of the patent application of the earlier filing date. The Non-Patent Document 7 has disclosed that, to inhibit deterioration in the retention of hydrogen atoms by the silicon nitride film, otherwise caused after data rewriting, an interfacing layer, capable of retaining stable hydrogen, may effectively be formed on an interface between an overlying silicon oxide film and an intermediate silicon nitride film. The Non-Patent Document 8 has disclosed that the interfacing layer, capable of retaining stable hydrogen is a silicon oxide-nitride film. However, in the Non-Patent Documents 7 and 8, the specific method for manufacturing a semiconductor memory according to Exemplary embodiment 2 of the present invention has not been disclosed.

Although the present invention has so far been described with reference to preferred exemplary embodiments, the present invention is not to be restricted to the exemplary embodiments. It is to be appreciated that one skilled in the art can change or modify the embodiments without departing from the spirit and the scope of the present invention. A large variety of combinations, substitutions or selections of the disclosed elements are also possible within the gamut of the invention.

Further tasks (problems), objects and exemplary embodiments of execution of the present invention will become more apparent from the entire disclosed contents of the present invention, inclusive of claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor memory, comprising:
   an insulating film interposed between a silicon substrate and a gate electrode, said insulating film comprising a stack of a first silicon oxide film, a silicon nitride film, and a second silicon oxide film, arrayed in this order from the side of said silicon substrate; and
   a hydrogen occluding film interposed on an interface between said second silicon oxide film and said gate electrode, and at least one of interfaces between said first silicon oxide film and said silicon nitride film and between said silicon nitride film and said second silicon oxide film.

2. The semiconductor memory according to claim 1, wherein the hydrogen concentration of said hydrogen occluding film is higher than $3 \times 10^{19}$ atom/cm$^3$.

3. The semiconductor memory according to claim 1, wherein said gate electrode is a floating gate.

4. The semiconductor memory according to claim 1, wherein said semiconductor memory is a capacitor.

5. The semiconductor memory according to claim 1, wherein said hydrogen occluding film contains more hydrogen atoms than each of said first and second silicon oxide films and said silicon nitride film.

6. A semiconductor memory, comprising:
   an insulating film interposed between a silicon substrate and a gate insulating film, said insulating film comprising a stack of a first silicon oxide film, a silicon nitride film and a second silicon oxide film, arrayed in this order from the side of said silicon substrate; and
   a hydrogen occluding film interposed on each of an interface between said silicon nitride film and said second silicon oxide film and an interface between said second silicon oxide film and said gate electrode.

7. The semiconductor memory according to claim 6, wherein said hydrogen occluding film comprises a silicon oxy-nitride film containing $Si_2N_2O$.

8. The semiconductor memory according to claim 6, wherein the hydrogen concentration of said hydrogen occluding film is higher than $3 \times 10^{19}$ atom/cm$^3$.

9. The semiconductor memory according to claim 6, wherein said gate electrode is a floating gate.

10. The semiconductor memory according to claim 6, wherein said semiconductor memory is a capacitor.

11. The semiconductor memory according to claim 6, wherein said hydrogen occluding film contains more hydrogen atoms than each of said first and second silicon oxide films and said silicon nitride film.

12. A semiconductor memory, comprising:
an insulating film interposed between a silicon substrate and a gate electrode, said insulating film comprising a stack of a first silicon oxide film, a silicon nitride film, and a second silicon oxide film, arrayed in this order from the side of said silicon substrate; and
a hydrogen occluding film interposed on at least one or all of interfaces between said first silicon oxide film and said silicon nitride film, between said silicon nitride film and said second silicon oxide film, and between said second silicon oxide film and said gate electrode,
wherein said hydrogen occluding film comprises a silicon oxy-nitride film containing $Si_2N_2O$.

13. The semiconductor memory according to claim 12, wherein the hydrogen concentration of said hydrogen occluding film is higher than $3\times10^{19}$ atom/cm3.

14. A semiconductor memory having a memory cell, said memory cell comprising:
an insulating film interposed between a silicon substrate and a gate electrode, said insulating film comprising a stack of first and second silicon oxide films with a silicon nitride film formed in between; and
a silicon oxy-nitride film interposed between said first silicon oxide film and said silicon nitride film, between said silicon nitride film and said second silicon oxide film, and between said second silicon oxide film and said gate electrode,
wherein said silicon oxynitride film includes at least a compound of Si and N having proportions of 2:2, respectively.

15. The semiconductor memory according to claim 14, wherein said gate electrode is a floating gate.

16. The semiconductor memory according to claim 14, wherein said memory cell is a capacitor.

17. The semiconductor memory according to claim 14, wherein said silicon oxy-nitride film contains more hydrogen atoms than each of said first and second silicon oxide films and said silicon nitride film.

18. A memory cell, comprising:
a substrate;
a gate electrode overlying said substrate; and
an insulating film disposed between said substrate and said gate electrode,
wherein said insulating film includes a sequential stack of a $Si_2N_2O$ film contacting said gate electrode, a first silicon oxide film, a second $Si_2N_2O$ film, a silicon nitride film, a second silicon oxide film, and at least one of said first and second $Si_2N_2O$ films contains more hydrogen atoms than at least one of said first and second silicon oxide films and said silicon nitride film.

* * * * *